US009741655B2

(12) United States Patent
Wang et al.

(10) Patent No.: US 9,741,655 B2
(45) Date of Patent: Aug. 22, 2017

(54) INTEGRATED CIRCUIT COMMON-MODE FILTERS WITH ESD PROTECTION AND MANUFACTURING METHOD

(71) Applicant: Silergy Semiconductor Technology (Hangzhou) LTD, Hangzhou (CN)

(72) Inventors: Albert Z. Wang, Grand Cayman (KY); Wen-Chin Wu, Grand Cayman (KY); Shijun Wang, Grand Cayman (KY); Nan Zhang, Grand Cayman (KY)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 201 days.

(21) Appl. No.: 13/742,126

(22) Filed: Jan. 15, 2013

(65) Prior Publication Data

US 2014/0198418 A1 Jul. 17, 2014

(51) Int. Cl.
*H01L 23/522* (2006.01)
*H03H 7/42* (2006.01)
*H01F 17/00* (2006.01)
*H01L 49/02* (2006.01)
*H01L 27/02* (2006.01)

(52) U.S. Cl.
CPC ..... *H01L 23/5227* (2013.01); *H01F 17/0013* (2013.01); *H01L 27/0288* (2013.01); *H01L 28/10* (2013.01); *H03H 7/427* (2013.01); *H01L 2924/0002* (2013.01)

(58) Field of Classification Search
CPC ......... H01F 17/0013; H01F 2017/0093; H01F 2027/2809; H01F 27/2804; H01F 27/2809; H03H 7/427; H03K 23/5227; H03K 27/0288

USPC .................................................. 361/56, 118
See application file for complete search history.

(56) References Cited

U.S. PATENT DOCUMENTS

| | | | |
|---|---|---|---|
| 8,102,223 B2* | 1/2012 | Umemoto et al. ............. 333/185 |
| 2006/0145804 A1* | 7/2006 | Matsutani et al. ............ 336/200 |
| 2008/0157341 A1* | 7/2008 | Yang ..................... H01L 23/467 257/700 |
| 2010/0225436 A1* | 9/2010 | Papavasiliou et al. ....... 336/200 |
| 2012/0086538 A1* | 4/2012 | Chu .............................. 336/206 |
| 2012/0162791 A1* | 6/2012 | Ku ..................... H02K 41/0356 359/824 |
| 2013/0135074 A1* | 5/2013 | Wi et al. ....................... 336/200 |

(Continued)

OTHER PUBLICATIONS

"Resistivity of Aluminum Oxide". Eunice Huang. Dec. 31, 2014.*

*Primary Examiner* — Stephen W Jackson
*Assistant Examiner* — Christopher Clark

(57) ABSTRACT

An integrated circuit common-mode electromagnetic interference filter incorporating electro-static discharge protection comprising two inductive coils is provided. A pair of primary and secondary spiral inductor coils is disposed corresponding to each other. A dielectric layer is used to separate the primary spiral inductor coil from the secondary spiral inductor coil electrically. Resistivity of a high-resistance substrate is more than 100 Ω-cm for supporting the primary spiral inductor coil, the secondary spiral inductor coil and the dielectric layer thereon. The proposed filter structure can be formed in integrated circuit (IC) back-end processes and thus be extraordinarily advantageous of effectively eliminating electromagnetic interferences and having electrostatic protection effect at the same time, while having small footprint.

14 Claims, 12 Drawing Sheets

(56) References Cited

U.S. PATENT DOCUMENTS

2013/0169382 A1* 7/2013 Kim et al. .............. 333/185
2014/0232501 A1* 8/2014 Kato ..................... 336/182

* cited by examiner

INTEGRATED CIRCUIT COMMON-MODE FILTERS WITH ESD PROTECTION AND MANUFACTURING METHOD

BACKGROUND OF THE INVENTION

Field of the Invention

The present invention relates to electromagnetic interference (EMI) filters in integrated circuit (IC) format incorporating electro-static discharge (ESD) protection components, and the manufacturing method Description of the Prior Art Electromagnetic interference (EMI) can affect electronic system performance, especially at electronic interfaces, e.g., Mobile Industry Processor Interface (MIPI), Universal Serial Bus (USB), High Definition Multimedia Interface (HDMI) and Mobile High-Definition Link (MHL), etc., which feature very high data transmission rates and very broad frequency bandwidth. Low-pass filters (LPF) can be used to block EMI interferers (or, noises) transmitting in both directions at the interfaces of electronic products. Critical specifications (i.e., specs) for EMI filters include low pass-band insertion loss (IL), high cut-off frequency ($f_C$), wide pass-band spectrum and high rejection-band attenuation. Low pass-band IL ensures minimum signal loss within the application frequency band. The cut-off frequency is defined by the frequency corresponding to the −3 dB insertion loss point of the useful signals. Pass-band allows the useful signals pass through and determines how many harmonics of the useful signal can be kept.

A wide pass-band allows high data-rate and ensures high level of signal integrity. Rejection-band generally covers the 800 MHz to 6 GHz frequency spectrum, corresponding to the carrier band frequencies of typical radio-frequency (RF) applications. −30 dB attenuation in the rejection-band is usually required to reduce the noise level by a factor of 1000 in power scale, meaning a high signal-to-noise ratio (SNR) of electronic systems.

In electronic products, noises can be generated within the systems or injected into the systems externally through various data interfaces (USB, HDMI. DVI, MIPI, etc.), which affects the useful signals and results in performance degradation of high-speed electronics. To alleviate the ever-increasing noise interfering problem within high-speed electronics, differential signal processing techniques are used in modern electronic systems, for example, low voltage differential signaling (LVDS), where the large common-mode noises can be removed while processing the small useful differential signals.

Common-mode filter (CMF) technique can be used to remove common-mode noises, while allowing the useful differential signals passing through with minimum loss. This is particularly critical to contemporary high-frequency and high-speed electronics, such as, high-definition displays, smart-phones, high-resolution cameras, and communication links with beyond giga bits per second (Gbps) data rates, etc. Existing CMF filter components, often called common-mode choke coils, include wire-wound type formed by winding copper wire around a ferrite core and laminate-type created by forming alternatively insulating layers and metal thin-film coil conductors on magnetic substrate through thin-film processing techniques. These common-mode choke coils are essentially discrete CMF components fabricated using various discrete component processing techniques, which translates into relatively large and thick footprint, hence making them not suitable for advanced electronic apparatus, such as smart-phones, which require very thin and small CMF components with very high performance.

In principle, a CMF device is a passive transformer, as shown in FIG. 1, with two coils, a primary coil and a secondary coil, formed close to each other so that the magnetic flux can be coupled into the two coils as much as possible. The critical performance specs for CMF are apparently high common-mode rejection and low differential-mode loss. To this end, a magnetic core, or, preferably a closed-loop magnetic circuit path, is used to direct the magnetic flux in order to suppress any magnetic loss. Hence, close and efficient magnetic coupling is required for high-performance CMF components, which can be easily implemented in fabricating discrete common-mode choke coils as mentioned above.

On the other hand, low insertion loss of common-mode choke coils require very low series resistance of the metal coils, which may be readily achieved in fabricating wire-wound and laminate CMF components by using thick metal layers. For these reasons, ferrite and ceramics based discrete CMFs have been widely used so far. However, these discrete type common-mode choke coils suffer from relatively low common-mode noise attenuation across the 700~2500 MHz spectrum, typically used for mobile devices today. In addition, today's mobile electronics feature extremely high system integration, which requires integration of CMF filter with ESD protection structure that cannot be realized using the abovementioned discrete type common-mode choke coils.

On account of above, it shall be obvious that there is indeed an urgent need for a common-mode EMI filter in IC format with integrated ESD protection being proposed nowadays.

SUMMARY OF THE INVENTION

In order to overcome the above-mentioned disadvantages, an objective in accordance with the present invention is provided for a common-mode EMI filter IC incorporating ESD protection, which forms very thin and small footprint common-mode filters in single chip or multiple-chip module (MCM) formats.

Another objective of the present invention is to design various high-efficient and very small footprint IC CMF filters with integrated ESD protection and to fabricate such components using IC processes and/or the metal redistribution layer (RDL) techniques.

In one aspect, the common-mode EMI filter circuit of the present invention comprises a primary spiral inductor coil, a secondary spiral inductor coil, a dielectric layer between the two coils, and a high-resistance substrate. The primary spiral inductor coil and the secondary spiral inductor coil are disposed corresponding to each other. The dielectric layer separates the primary spiral inductor coil from the secondary spiral inductor coil electrically. The resistivity of the high-resistance substrate is more than 100 Ω-cm. The primary spiral inductor coil, the secondary spiral inductor coil and the dielectric layer are disposed on top of the high-resistance substrate.

In one embodiment, the CMF filter circuit is composed of coupled inductor coils formed with multiple-layer metal spirals.

In one embodiment, the primary and secondary spiral coupled inductor coils of the CMF filter have interdigitated spiral layout on the same metal layer to enhance the inductive coupling effect.

In one embodiment, special re-distribution layer (RDL) process techniques are used to make the CMF filter with thick metal and fine pitch.

In one embodiment, the RDL-fabricated CMF filter uses multiple metal layers for each spiral inductor coil.

In one embodiment, the CMF filter utilizes laterally-laid inductor coils.

These and other objectives of the present invention will become obvious to those of ordinary skill in the art after reading the following detailed description of preferred embodiments.

It is to be understood that both the foregoing general description and the following detailed description are exemplary, which are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
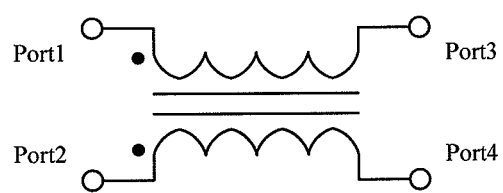
FIG. 1 shows a schematic view of a conventional CMF filter circuit.

Reference will now be made in details to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In order to achieve the purpose of eliminating electromagnetic interferences and having electrostatic protection effect, the proposed structure of the present invention provides an integrated circuit common-mode EMI filter incorporating ESD protection, in which the two coupled spiral inductor coils can be formed in typical IC back-end processes.

Figure 2:
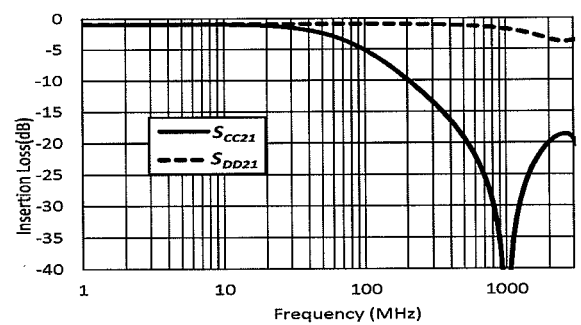
FIG. 2 Illustrates transmission gain for a CMF filter circuit characterized by S-parameters.

Considering that a CMF filter serves to suppress the common-mode noises as much as possible and to pass differential signals with as little insertion loss as possible, as illustrated in FIG. 2, the IL for the differential signals, characterized by transmission gain ($S_{21}$) for the signals measured in S-parameters (entitled $S_{DD21}$) should be very low within the pass-band, while the common-mode rejection, characterized by common-mode transmission gain (entitled $S_{CC21}$) must be as high as possible.

Figure 3:
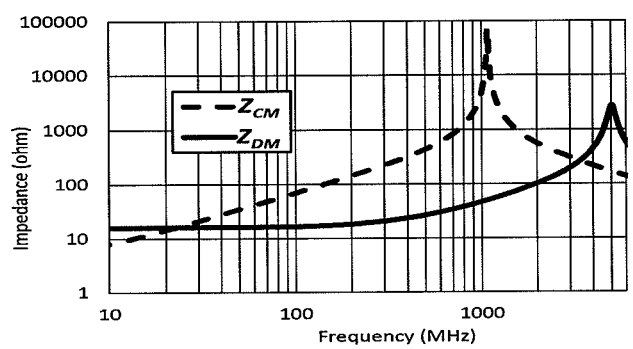
FIG. 3 Illustrates transmission impedance for a CMF filter circuit characterized by Z-parameters.

An alternative expression of these features are the transmission impedance as depicted in FIG. 3, where the differential mode impedance (entitled $Z_{DM}$) should be as low as possible within the pass-band, while the common-mode impedance (entitled $Z_{CM}$) must be as high as possible.

Figure 4:
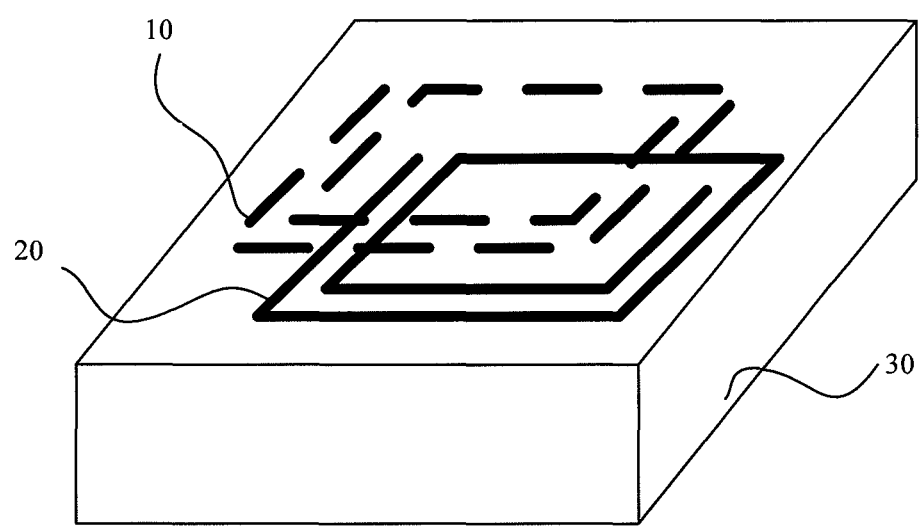
FIG. 4 shows a layout illustration of a CMF filter circuit structure in accordance with one embodiment of the present invention.

Refer to FIG. 4, which shows a layout illustration of a CMF filter circuit structure in accordance with one embodiment of the present invention.

Figure 10A:
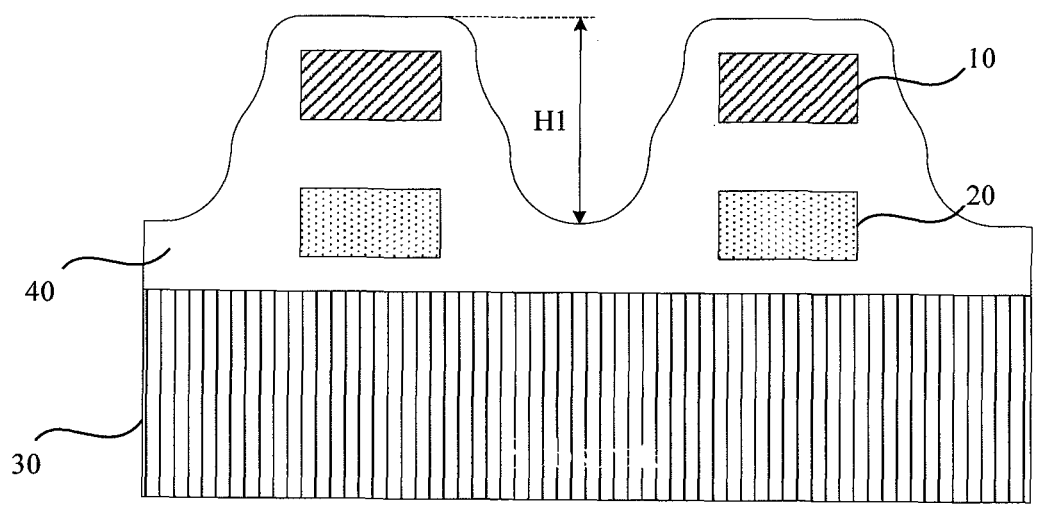
FIG. 10A shows a cross sectional view of the CMF filter circuit in FIG. 9A.
Figure 10B:
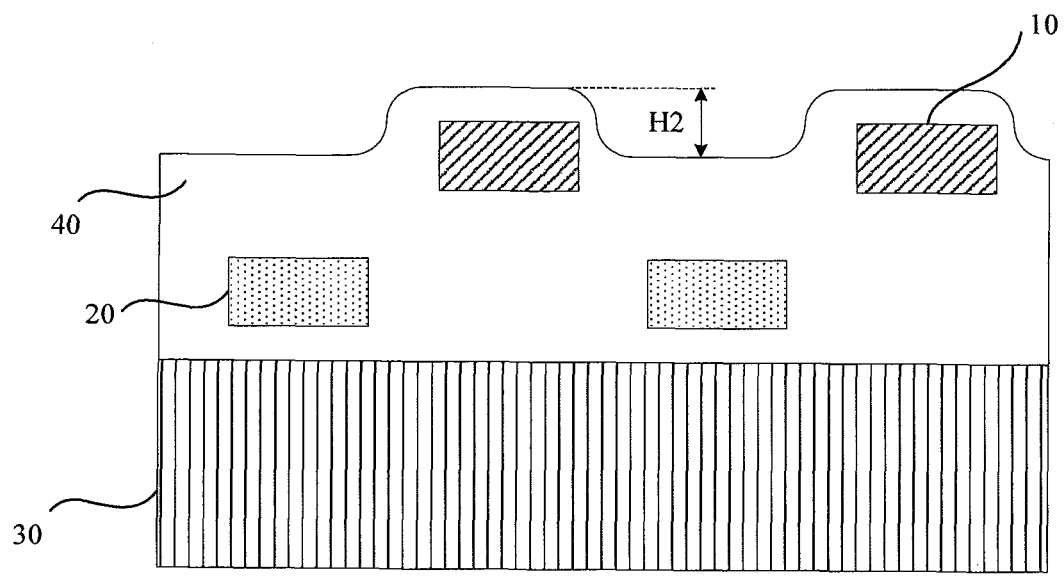
FIG. 10B shows a cross sectional view of the CMF filter circuit in FIG. 9B.

In the embodiment, a primary spiral inductor coil 10 is disposed corresponding to a secondary spiral inductor coil 20, and these two spiral inductor coils are separated by a dielectric layer 40 (see FIG. 10A and FIG. 10B). The primary spiral inductor coil 10, the secondary spiral inductor coil 20 and the dielectric layer 40 are disposed on top of a high-resistance substrate 30. A resistivity ($\rho$) of the substrate 30 is more than 100 $\Omega$-cm (Ohm-cm).

Figure 5:
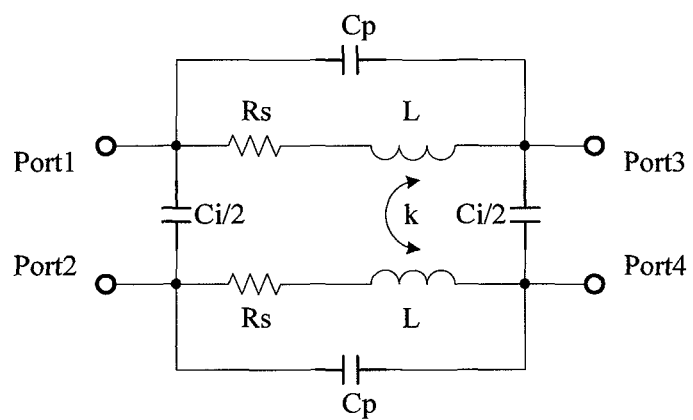
FIG. 5 shows an equivalent circuit model for the CMF filter circuit based on FIG. 4.
Figure 6A:
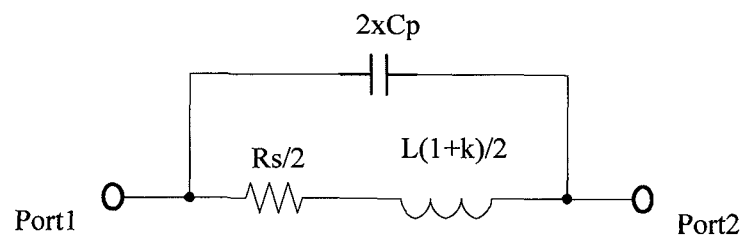
FIG. 6A shows an equivalent circuit model of the CMF filter circuit operating in a common-mode.
Figure 6B:
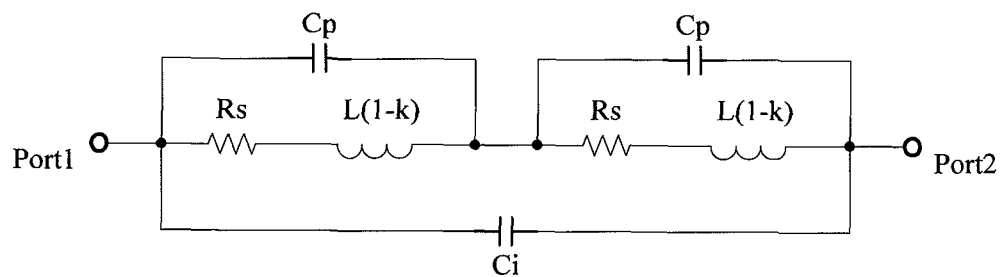
FIG. 6B shows an equivalent circuit model of the CMF filter circuit operating in a differential-mode.

According to the embodiment of the present invention, the high-$\rho$ substrate 30 serves to suppress the Eddy current that is a main source for electrical energy loss and the high-$\rho$ substrate 30 can be made of silicon in a preferred embodiment. FIG. 5 shows an equivalent circuit model for the CMF filter, wherein L is inductance for the primary and secondary inductor spirals, respectively, $R_S$ is series resistance of the inductor spiral, Ci is coupling capacitance between the two coupled inductor spirals, Cp is other parasitic capacitor associated with each inductor spiral, and k is the magnetic coupling coefficient of the two inductor spirals. FIGS. 6A and 6B show the equivalent circuit model of the CMF operating in a common-mode and in a differential-mode, respectively.

According to FIG. 6A, the common-mode impedance can be expressed as, $$Z_{CM} = \frac{1}{2}[j\omega L(1+k) + R_S] \mathbin{/\mkern-5mu/} \frac{1}{j\omega 2 C_P} \qquad (1)$$

with its absolute value given by, $$|Z_{CM}| = \frac{1}{2}\sqrt{\frac{\omega^2 L^2(1+k)^2 + R_S^2}{[1 - \omega^2 L(1+k)C_P]^2 + \omega^2 R_S^2 C_P^2}} \qquad (2)$$

where ω is angular frequency.

$$\text{For } R_s^2 \ll \omega^2 L^2(1+k)^2 \text{ and } \omega = \frac{1}{\sqrt{LC_P(1+k)}},$$

equation (2) can be simplified as, $$|Z_{CM}|_{max} \approx \frac{L(1+k)}{2 R_S C_P}. \qquad (3)$$

Similarly, according to FIG. 6B, the differential-mode impedance can be expressed as, $$Z_{DM} = \left\{2[jw(1-k) + R_s] \mathbin{/\mkern-5mu/} \frac{2}{jwC_p}\right\} \mathbin{/\mkern-5mu/} \frac{1}{jwC_i} \qquad (4)$$

And, $$|Z_{DM}| = \frac{2\sqrt{R_s^2 + w^2 L^2(1-k)^2}}{\sqrt{[1 - w^2 L(1-k)(C_p + 2C_i)]^2 + w^2 R_s^2 (C_p + 2C_i)^2}} \qquad (5)$$

For $R_s^2 \ll \omega^2 L^2 (1-k)^2$ and $$\omega = \frac{1}{\sqrt{L(C_p + 2C_i)(1-k)}},$$

it yields, $$|Z_{DM}|_{max} \approx \frac{2L(1-k)}{R_S(C_P + 2Ci)}. \qquad (6)$$

Figure 7:
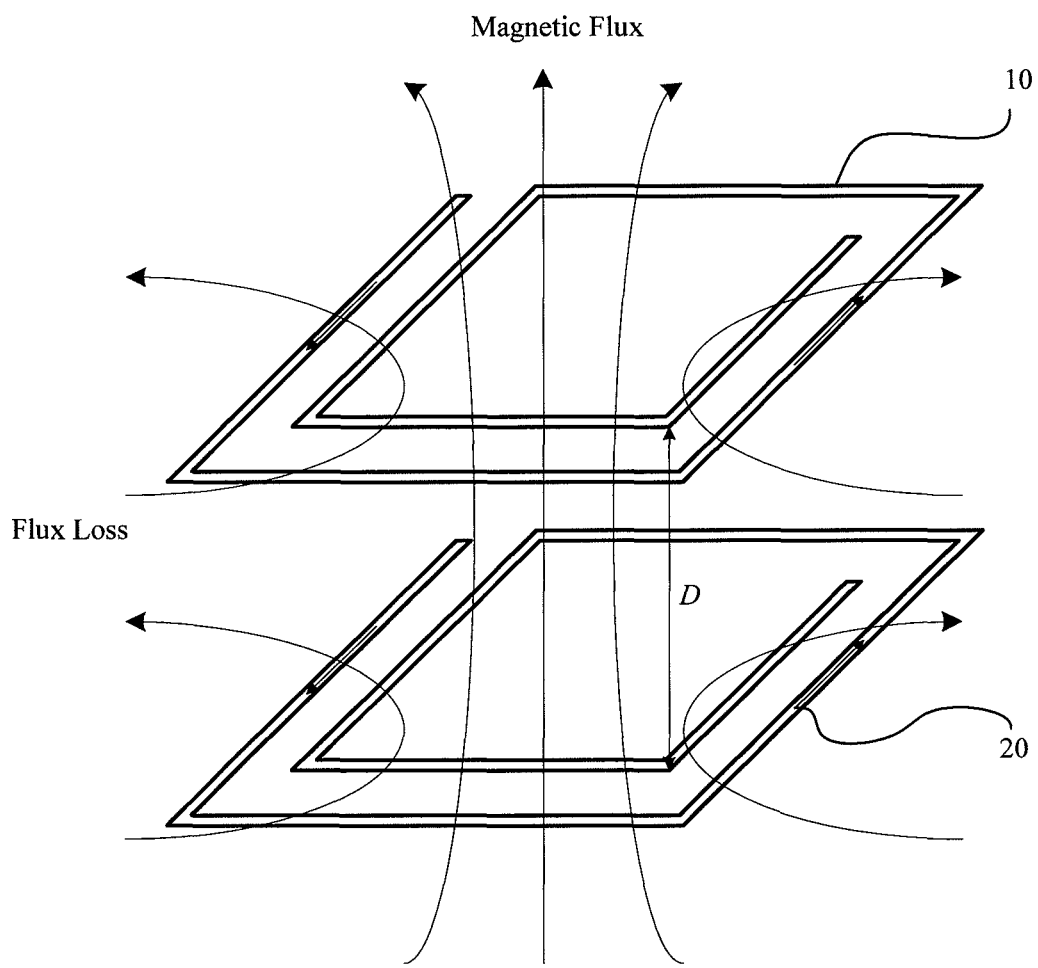
FIG. 7 depicts magnetic coupling effect between a primary and secondary spirals of an IC CMF filter circuit.

For an ideally coupled CMF structure, we have k=1, which means no loss of magnetic flux between the two spirals. Unlike in discrete ferrite or ceramics based CMF structures where magnetic cores serve to enhance magnetic coupling, it is generally difficult to integrate magnetic materials into IC processes. Hence, the CMF structure in the first embodiment does not have any magnetic medium integrated. As illustrated in FIG. 7, to achieve good magnetic coupling inside an IC CMF structure (i.e., a higher k), careful layout design is required to ensure exact same spiral layout shape for the two inductor coils, which should be overlapping each other closely. In addition, a vertical distance (D) between the two inductor spirals in the thickness direction should be as short as possible to ensure excellent magnetic coupling, hence the highest possible k value. However, a smaller D directly results in a larger coupling capacitance Ci, which dramatically degrades the signal integrity of the differential-mode signals as shown in FIG. 6B. Therefore, in order to balance the design trade-off between k and Ci, the distance D must be carefully designed to achieve overall CMF filter performance.

Figure 8A:
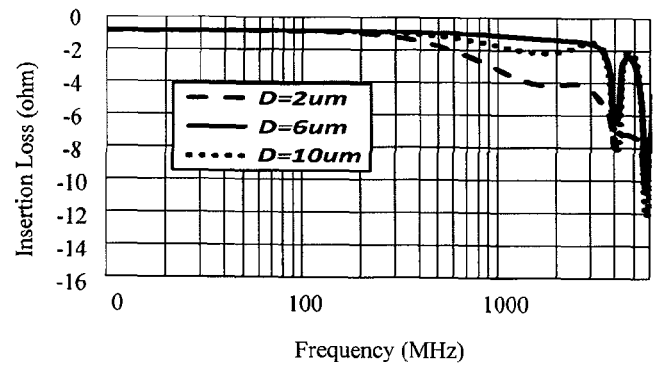
FIGS. 8A-8C show simulation comparison of differential-mode and common-mode insertion losses related the vertical distance between the two inductor spirals.
Figure 8B:
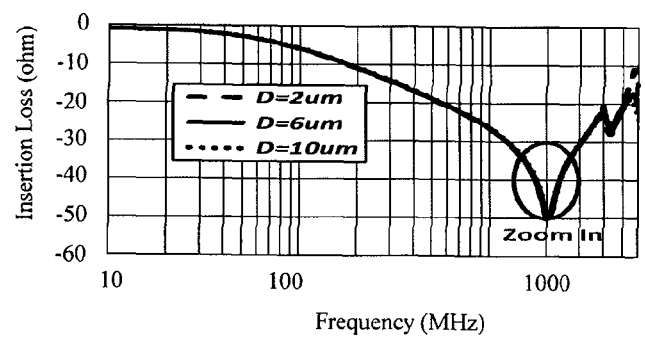
Figure 8C:
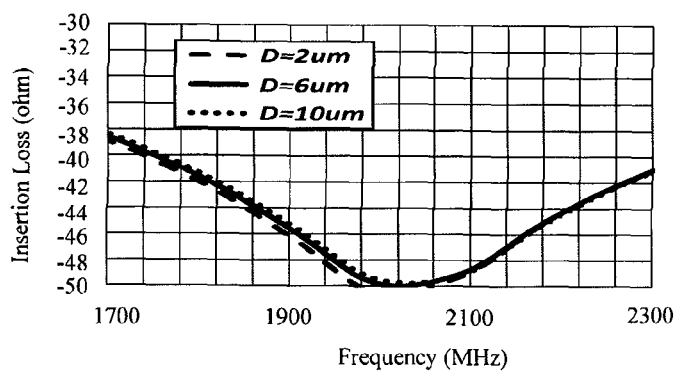

FIGS. 8A-8C depicts the $S_{21}$ behaviors related to D as simulated for several split values for the vertical distance between the two inductor spirals. Obviously, the coupling effect decreases as D increases, i.e., $k_{D=2\ um} > k_{D=6\ um} > k_{D=10\ um}$. It is clearly observed that the D has minor impact on the common-mode $S_{CC21}$ within the concerned distance range as shown in FIGS. 8B and 8C. However, D has significant influence on the differential-mode $S_{DD21}$ as shown in FIG. 8A, i.e., Ci with D=2 μm is too large while k for D=10 μm is too small, both will significantly affect $S_{DD21}$. It is found that a well-balanced inter-spiral distance, for example, D=6 μm in this embodiment, shall achieve an optimum CMF filter performance.

In order to reduce insertion loss to differential mode signals, the metal spiral series resistance must be minimized. Therefore, very thick metal line thickness (up to 10 μm), as opposed to normal metal interconnect thickness of 1-3 μm used in standard IC processes, should be used in CMF designs. Meanwhile, metals with low-resistance, such as copper (Cu) and silver (Ag), etc., can also be used to reduce metal wire resistance compared with aluminum (Al).

Figure 9A:
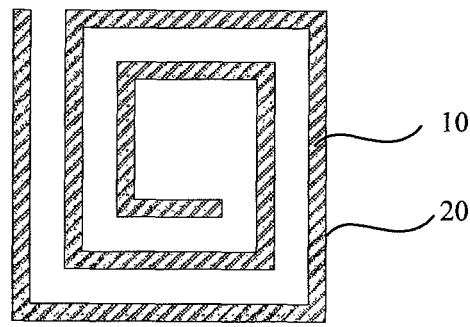
FIG. 9A shows a layout illustration of the CMF filter including the primary spiral inductor coil and the secondary spiral inductor coil having the same layout shapes and completely overlapping each other vertically in accordance with a second embodiment of the present invention.
Figure 9B:
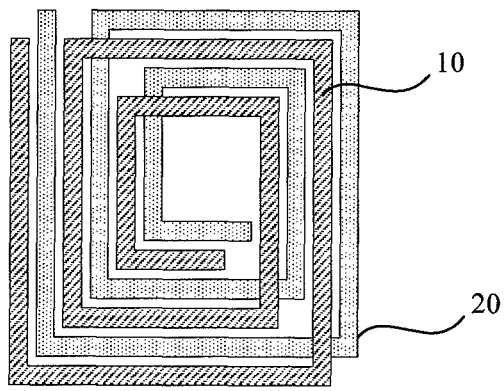
FIG. 9B shows a layout illustration of the CMF filter including the primary spiral inductor coil and the secondary spiral inductor coil having the same layout shapes, but do not overlap each other completely, in accordance with a third embodiment of the present invention.

Moreover, please refer to FIG. 9A and FIG. 9B for the second and third embodiment of the present invention, wherein FIG. 9A shows an embodiment of the CMF filter including the primary spiral inductor coil and the secondary spiral inductor coil having the same layout shapes and completely overlapping each other vertically. FIG. 9B shows an embodiment of the CMF filter including the primary spiral inductor coil and the secondary spiral inductor coil having the same layout shapes, but do not overlap each other completely.

As shown in the embodiments of FIG. 9A, since the primary spiral inductor coil 10 and the secondary spiral inductor coil 20 have the same layout shapes and completely overlap each other vertically, the CMF filter achieves the highest coupling effect of k≥0.97. However, the coupling capacitance $C_i$ becomes very large, which results in severe degradation of differential mode signals and very low $f_C$. Another major problem associated to the complete-overlap layout design corresponding to FIG. 9A is shown in FIG. 10A where since very thick metal wires (e.g., 10 μm) are needed for the primary and secondary spirals, it will cause serious surface uniformity issue in IC back-end processing and requires complicated and expensive process steps to achieve good surface flatness.

On the other hand, FIG. 10B shows an alternative non-overlap spiral layout corresponding to FIG. 9B, which significantly reduce the surface roughness and improve the surface uniformity. Compared FIG. 10B to FIG. 10A, it is easily seen that the distance H2 is much shorter than the distance H1. Another major benefit of the non-overlap layout design is that the coupling capacitance $C_i$ can be significantly reduced. Meanwhile, the inductive coupling coefficient k only slightly decreases, i.e., k<0.01 reduction observed in this design. To simultaneously achieve high inductive coupling and low coupling capacitance, the dielectric materials must have very low dielectric constant (i.e., permittivity) and high magnetic permeability.

Figure 11:
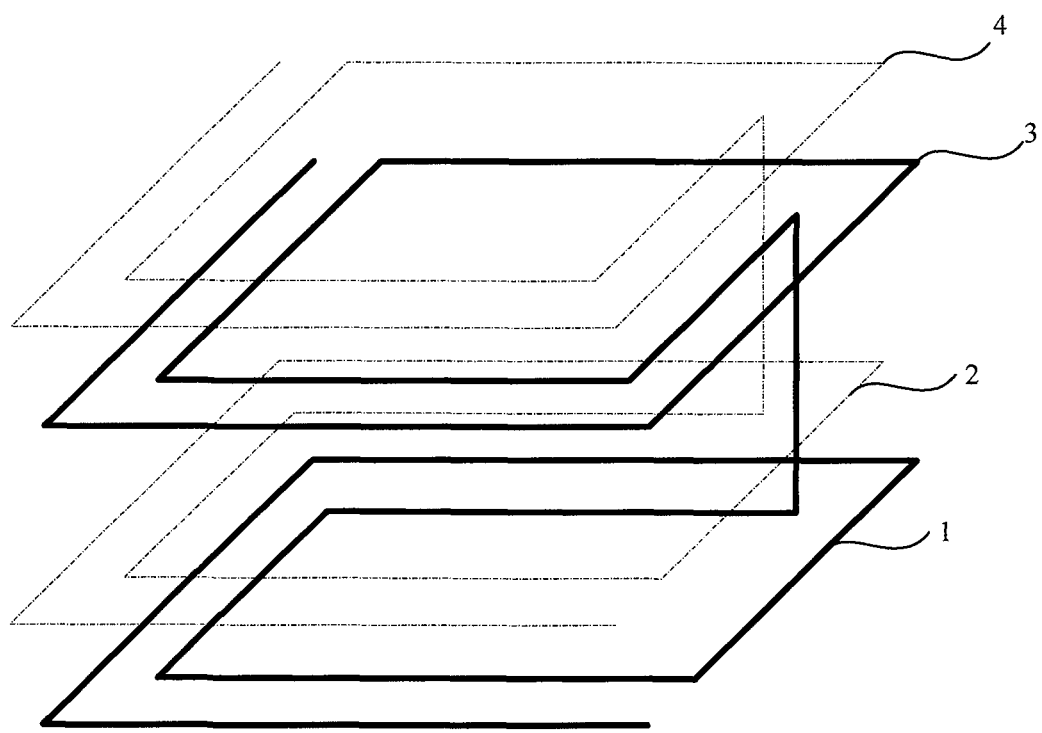
FIG. 11 shows a layout illustration of an exemplar 4-metal-layer CMF filter circuit structure in accordance with a fourth embodiment of the present invention.

Refer to FIG. 11 for the fourth embodiment of the present invention, in which FIG. 11 shows a layout illustration of an exemplar 4-metal-layer CMF filter circuit structure in accordance with one embodiment of the present invention. In this embodiment, the primary spiral inductor coil is implemented by using multiple metal layers, i.e., the metal layers 1 and 3 (from the bottom), while the secondary spiral inductor coil is implemented by using the metal layer 2 and 4.

In the fourth embodiment, multiple-layer metal spirals (i.e., stacked spirals 1-4), separated by dielectric layers, are used to form both primary and secondary inductor coils that occupy alternative layers.

The multiple-layer stacked spiral structures not only deliver the required very high inductance values (typically more than 100 nH), but also significantly enhances the inductive coupling effect between the primary and secondary coils due to its interdigitated layer structure. Therefore, the multiple-layer CMF filter as shown in FIG. 11 has much better coupling k factor. Further, the two spiral layout designs, i.e., complete-overlap previously shown in FIG. 9A and non-overlap in FIG. 9B, can also be applied to the multiple-layer CMF filter structures.

Figure 12:
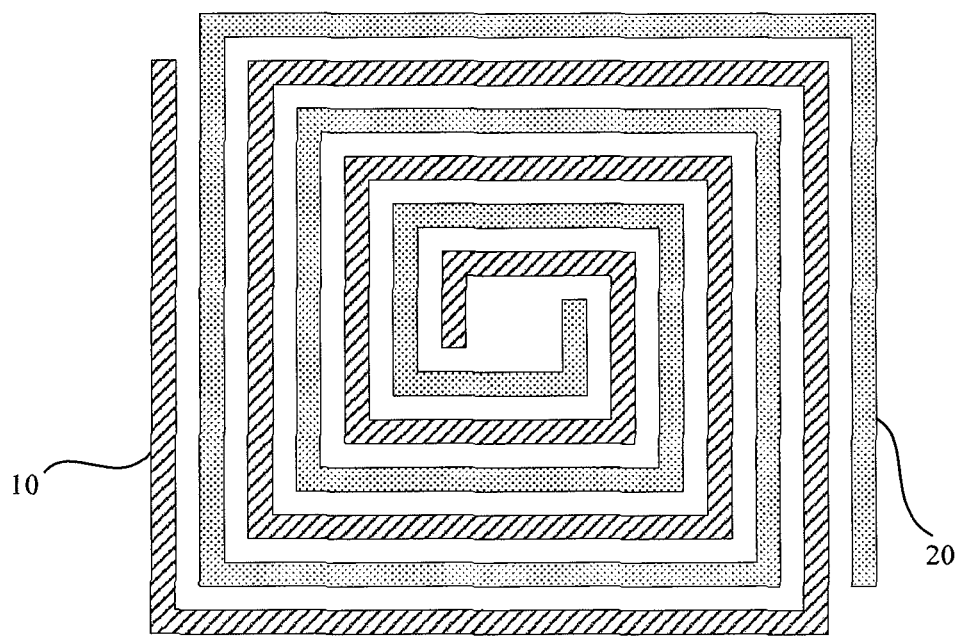
FIG. 12 shows a layout illustration of a same-layer CMF filter circuit structure in accordance with a fifth embodiment of the present invention.

FIG. 12 shows a layout illustration of a same-layer CMF filter circuit structure in accordance with the fifth embodiment of the present invention. Referring to FIG. 12, the primary spiral inductor coil 10 is formed in a first metal layer and the secondary spiral inductor coil 20 is formed in a second metal layer. In the fifth embodiment, the primary 10 and secondary spiral inductor coils 20 have special layout so that the first and second metal coils are formed laterally on the same metal layer. However, in an interdigitated format, which significantly enhances the inductive coupling effect of the two spiral inductors, the spirals of the two coils shall be insulated by dielectric materials laterally on the same layer.

Moreover, according to the present invention, special fine-pitch thick-metal re-distribution layer (RDL) process techniques are proposed to form very thick (10-30 µm) metal lines, including low-resistivity metals such as copper (Cu), silver (Ag) or alloys (e.g., Cu/Au/Ni), etc., to make high-performance CMF filter structures described in the above-mentioned embodiments. The RDL technique makes it easier to fabricate CMF filters with very large inductance (up to several hundreds of nano Henry, nH) and very low metal resistance, which is difficult to achieve if using normal IC processes. Both low-resistivity and very thick metal layer is critical to reduce metal spiral series resistance. Therefore, two types of RDL processes may be used according to the present invention.

In one embodiment of the present invention, the RDL process is an island-type process, which starts with a dielectric layer deposition followed by metal (e.g., Cu) seed sputtering. Photo mask is then applied to form the required metal line patterns. Then, electrochemical plating (ECP) step is used to form the thick Cu layer. Metal etching follows to form the required thick Cu spirals, which looks like an "island" on top of the dielectric layer. Normally, this island-type RDL technique forms metal lines with relatively wide pitch, e.g., about 10 µm in line width and spacing.

In another embodiment of the present invention, the RDL process is a trench-type process, which starts with dielectric layer deposition. The metal trench photo mask is then applied followed by reactive-ion etching (RIE) to create fine-pitch trench in the dielectric layer. Next, Cu seed sputtering is applied and the ECP step is used to fill the trench and form the damascene Cu spirals required. This trench-type damascene Cu RDL process can achieve both very thick metal line (10-30 µm) and very fine metal pitch (metal line width and spacing less than 5 µm). The very thick metal spiral helps to reduce the series resistance substantially, while the fine-pitch of metal lines is critical to manufacturing small footprint CMF as demanded by today's electronics. In addition, various low-resistivity metals and their alloys can also be used to fabricate high-performance CMF filters using the thick-metal RDL techniques. Apart from above, the new thick-metal RDL techniques depicted in the present invention may also be used to manufacture multiple-layer CMF filters as previously-described in the fourth embodiment to achieve even better CMF filter performance. Thus, the proposed invention is fully described abovementioned, but not limited thereto.

Figure 13:
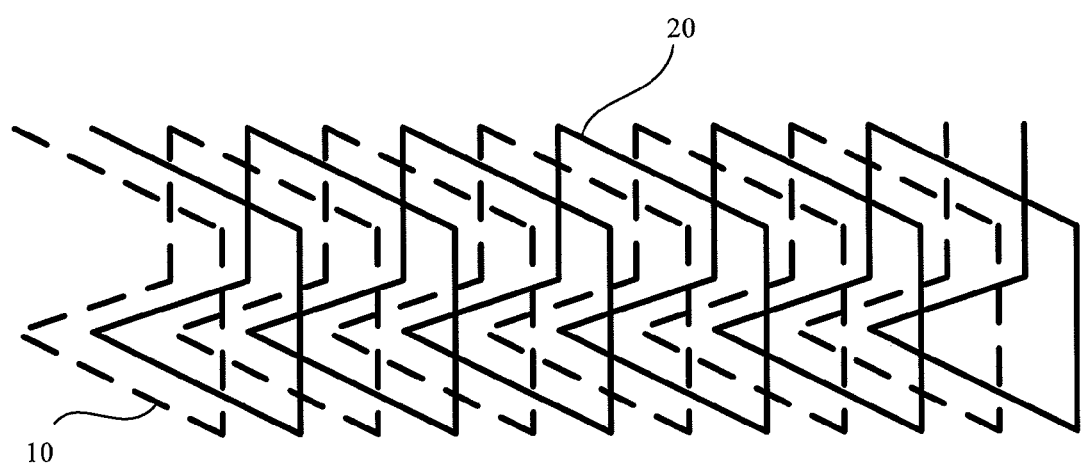
FIG. 13 shows a layout illustration of a laterally-laid CMF filter circuit structure in accordance with a sixth embodiment of the present invention

Referring now to FIG. 13, which shows a layout illustration of a laterally-laid CMF filter circuit structure in accordance with the sixth embodiment of the present invention. According to the sixth embodiment of the present invention, the laterally-laid CMF filter structure is formed in such a way that the primary spiral inductor coil 10 and the secondary spiral inductor coil 20 are two multiple-turn solenoids with the spiral turns of the primary and secondary inductors placed alternatively and next to each other in an interdigitated format. The primary and secondary inductors 10, 20 are formed in two metal layers (i.e., upper and lower metal layers) separated by a dielectric layer. The upper metal line of each turn, which is a long line in diagonal direction, is formed with an angle in the top metal layer; while the lower metal line of each turn, which is also long but not in diagonal direction, is formed in the bottom metal layer. The directions and angles for the upper and lower metal lines can be reversed in layout designs as needed, or modified as necessary. Thick through-dielectric metal vias (vertical metal pillar plugs) can be used to connect the upper and lower metal lines of the same inductor (spiral). The closely coupled multiple-turn transformer with interdigitated metal turns ensures excellent inductive coupling between the lateral primary and secondary coils, which results in excellent CMF filter performance.

As a result, to sum up, the common-mode EMI filter IC of the present invention provides high efficiency in removing common-mode noises, while allowing the useful differential signals passing through with minimum loss. Also, the common-mode EMI filter IC can be integrated with ESD protection components and form small footprint CMF ICs in single or multiple-chip module formats. The common-mode EMI filter ICs with integrated ESD of the present invention consists of two coupled spiral inductor coils formed in IC back-end processes.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A common-mode EMI filter IC incorporating ESD protection, comprising:
   a primary spiral inductor coil;
   a secondary spiral inductor coil disposed corresponding to said primary spiral inductor coil, wherein said secondary spiral inductor coil has the same layout shape and orientation as said primary spiral inductor coil, and wherein each of said primary and secondary spiral inductor coils comprises a metal line formed by a fine-pitch thick metal re-distribution layer (RDL) process technique and having a pitch of less than 5 µm and a thickness from 10 µm to 30 µm for reduced insertion loss;
a dielectric layer electrically separating said primary spiral inductor coil and said secondary spiral inductor coil; and
a high-resistance substrate, wherein said primary spiral inductor coil, said secondary spiral inductor coil, and said dielectric layer are disposed on top of said high-resistance substrate, and a resistivity of said substrate is greater than 100 Ω-cm.

2. The common-mode EMI filter IC incorporating ESD protection of claim 1, wherein said substrate comprises silicon.

3. The common-mode EMI filter IC incorporating ESD protection of claim 1, wherein a vertical distance between said primary spiral inductor coil and said secondary spiral inductor coil in a thickness direction is 6 µm.

4. The common-mode EMI filter IC incorporating ESD protection of claim 1, wherein said dielectric layer substantially surrounds both of said primary spiral inductor coil and said secondary spiral inductor.

5. The common-mode EMI filter IC incorporating ESD protection of claim 1, wherein said primary spiral inductor coil and said secondary spiral inductor coil partially overlap each other vertically such that said secondary spiral inductor coil crosses said primary spiral inductor coil at a different location for each of a plurality of turns.

6. The common-mode EMI filter IC incorporating ESD protection of claim 1, wherein at least one of said primary spiral inductor coil and said secondary spiral inductor coil is implemented using multiple metal layers.

7. The common-mode EMI filter IC incorporating ESD protection of claim 1, wherein said primary spiral inductor coil is formed in a first metal layer, and wherein said secondary spiral inductor coil is formed in a second metal layer.

8. The common-mode EMI filter IC incorporating ESD protection of claim 1, wherein said RDL process technique comprises an island-type process.

9. The common-mode EMI filter IC incorporating ESD protection of claim 1, wherein said RDL process technique comprises a trench-type process.

10. The common-mode EMI filter IC incorporating ESD protection of claim 9, wherein said trench-type process follows dielectric layer deposition.

11. The common-mode EMI filter IC incorporating ESD protection of claim 6, wherein said multiple metal layers are implemented using said fine-pitch thick metal RDL process technique.

12. The common-mode EMI filter IC incorporating ESD protection of claim 1, wherein said primary spiral inductor coil and said secondary spiral inductor coil comprise two multiple-turn solenoids with spiral turns of said primary and secondary spiral inductors placed alternatively and next to each other in an interdigitated format to form a laterally-laid CMF circuit.

13. The common-mode EMI filter IC incorporating ESD protection of claim 12, wherein said primary spiral inductor coil is formed in an upper metal layer, said secondary spiral inductor coil is formed in a lower metal layer, and said upper metal layer of each turn forms a long line in a diagonal direction.

14. The common-mode EMI filter IC incorporating ESD protection of claim 1, wherein said secondary spiral inductor coil is disposed offset to said primary spiral inductor coil in both an x-axis direction and a y-axis direction.

* * * * *